(12) United States Patent
Li et al.

(10) Patent No.: US 6,503,694 B1
(45) Date of Patent: Jan. 7, 2003

(54) DEVELOPER SOLUTION AND EDGE BEAD REMOVER COMPOSITION

(75) Inventors: Chun-Hsien Li, Hsin-Yin (TW); Pei-Hua Sheng, Tainan (TW); Bo-Hsuan Lin, Tainan (TW); Yuan-Pin Lee, Tainan (TW); Chih-Neng Chang, Tainan Hsien (TW)

(73) Assignees: Chi Mei Corporation, Tainan Hsien (TW); Chi Mei Optoelectronics Corporation, Tainan Hsien (TW)

( * ) Notice: Subject to any disclaimer, the term of this patent is extended or adjusted under 35 U.S.C. 154(b) by 0 days.

(21) Appl. No.: 09/878,248

(22) Filed: Jun. 12, 2001

(51) Int. Cl.[7] .............................. G03F 7/32; G03F 7/42
(52) U.S. Cl. .................. 430/331; 430/329; 510/176
(58) Field of Search ................... 430/331, 329, 430/493; 510/176

(56) References Cited

U.S. PATENT DOCUMENTS

| | | | | |
|---|---|---|---|---|
| 4,820,621 A | * | 4/1989 | Tanka et al. | 430/331 |
| 5,106,724 A | * | 4/1992 | Nagami et al. | 430/331 |
| 5,122,438 A | * | 6/1992 | Nagami et al. | 430/331 |
| 5,217,848 A | * | 6/1993 | Uehara et al. | 430/331 |
| 5,532,116 A | * | 7/1996 | Suzuki et al. | 430/331 |
| 5,922,522 A | * | 7/1999 | Barr et al. | 430/331 |
| 6,063,550 A | * | 5/2000 | Lundy et al. | 430/331 |

* cited by examiner

*Primary Examiner*—Richard L. Schilling
(74) *Attorney, Agent, or Firm*—Finnegan, Henderson, Farabow, Garrett & Dunner, L.L.P.

(57) ABSTRACT

A developer solution and edge bead remover. composition includes:

(A) water;
(B) at least a basic compound; and
(C) a non-ionic surfactant having the structure (I):

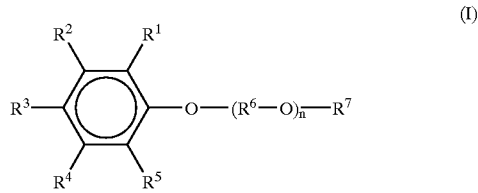

wherein:
R1, R2, R3, R4 and R5 are selected from the group consisting of hydrogen, alkyl, aryl, aralkyl and halogen, and at least two of R1, R2, R3, R4 and R5 are selected from the group consisting of aralkyl and aryl, R6 is selected from the group consisting of ethylene, propylene, and butylene, R7 is selected from the group consisting of hydrogen, acetyl, alkyl, and aryl, and n is an integer ranging from 6 to 23.

4 Claims, 1 Drawing Sheet

DEVELOPER SOLUTION AND EDGE BEAD REMOVER COMPOSITION

FIELD OF THE INVENTION

The present invention relates to a developer solution and edge bead remover composition, more particularly to a liquid composition useful in the manufacture of integrated circuits, printed circuit boards, color liquid crystal display (LCD) devices, and color filters in developing treatment of an actinic ray-sensitive resist, or for removing undesired photoresist parts stuck to the periphery of a substrate.

DESCRIPTION OF THE RELATED ART

During the manufacture of a color filter, a coating of a photoresist composition is applied to a substrate by various methods known in the art, such as dye method, printing method, electro-deposition, and pigment dispersing. The pigment dispersing compositions generally comprise a pigment dispersing agent, a suitable solvent, an actinic ray-sensitive resin and other additives. The substrate is subjected to pre-baking, and is subsequently exposed using a photomask. The unexposed region of the photoresist is then developed using a developer solution, thereby forming the desired pattern. There are many known development methods, including a dipping development method, a spray development method, and a puddle development method, etc.

After coating, pre-baking, and exposure of the color resist, the un-exposed region of the photoresist is dissolved and removed with the use of a basic developer solution. However, during the development process, film residue or scum deposition might remain on the substrate to adversely affect the accuracy of the photoresist pattern formed on the substrate. Japanese Patent Publication No. 10-10749discloses a developer solution composition comprising water, a basic compound, and an anionic surfactant. Use of the developer solution composition permits the formation of an accurately patterned photoresist layer without scum deposition. However, the developer composition has a poor defoaming characteristic and a poor dispersion stability with respect to a photoresist, and is only useful within a relatively narrow operating temperature range.

A photoresist composition is typically spun onto a silicon wafer or a glass substrate so as to be coated on a surface of the same. It is likely that the photoresist will undesirably stick to a peripheral part or edge side part or rear surface part of the substrate. As shown in FIG. 1, a substrate 11 is coated with a photoresist layer 12 by a known spinning technique. The photoresist layer 12 includes a peripheral part 13 undesirably stuck to a periphery of the substrate 11, and an edge side part 14 and a rear surface part 15 that are undesirably stuck to edge sides and a rear surface of the substrate 11. The undesired parts of the photoresist material on the peripheral part 13 or the edge side part 14 or the rear surface part 15 of the substrate become brittle during the pre-baking process, and easily peel off during transport of the substrate. The peeled-off chips of the photoresist material can have deleterious effects on subsequent processes. For instance, the photoresist chips can attach to the photomask in the subsequent exposure process, thereby resulting in an increase in the frequency of cleaning of the photomask. The peeled-off photoresist chips can further result in defects which are detrimental to the yield of LCD devices.

Japanese Patent Publication No. 63-69563 discloses a plurality of solvents for removing undesired photoresist material stuck to the peripheral part 13, the edge side part 14 and the rear surface part 15 of the substrate. Examples of the solvents include glycol derivatives, such as ethylene glycol monoethyl ether, ethylene glycol monoethyl ether acetate, propylene glycol alkyl ether, and propylene glycol alkyl ether acetate; ketones, such as acetone, methyl ethyl ketone, cyclohexanone, and methyl butyl ketone; and ester, such as methyl lactate, ethyl lactate, methyl acetate, ethyl acetate, and butyl acetate. The solvents are used alone or in combination. However, the effect of the aforementioned solvents for removing the undesired photoresist material and reducing the scum deposition is not satisfactory. Apart of the undesired photoresist material still remains on the substrate. Moreover, the solvents are generally hazardous to the environment. The glycol derivatives are relatively toxic and are a source of environmental pollution. The ketones, such as acetone and methyl ethyl ketone, generally have relatively low flash points and cause environmental pollution.

SUMMARY OF THE INVENTION

Therefore, the main object of the present invention is to provide a developer solution and edge bead remover composition which has an excellent developing and removing effect, which can be used for reducing scum deposition, which is low intoxicity and is environmental friendly, which has a high defoaming characteristic, which can be used at a relatively wide range of operating temperature, and which has an enhanced dispersion stability with respect to photoresist material.

According to one aspect of the present invention, a developer solution composition is provided for use in developing treatment of an actinic ray-sensitive resist. The developer solution composition comprises:

(A) water; (B) 0.01~5 wt % of at least a basic compound; and (C) 0.01~3.5 wt % of a non-ionic surfactant having the structure (I):

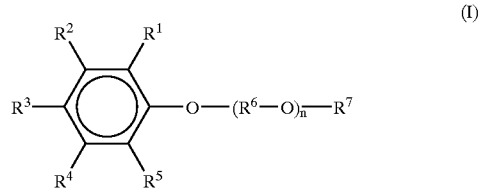

wherein:
R1, R2, R3, R4 and R5 are selected from the group consisting of hydrogen, alkyl, aryl, aralkyl and halogen, and at least two of R1, R2, R3, R4 and R5 are aralkyl or aryl, R6 is selected from the group consisting of ethylene, propylene, and butylene, R7 is selected from the group consisting of hydrogen, acetyl, alkyl, and aryl, and n is an integer ranging from 6 to 23.

According to another aspect of the present invention, an edge bead remover composition is provided for removing undesired photoresist residue stuck to the periphery or a region of a liquid crystal display (LCD) substrate. The edge bead remover composition comprises: (A) water; (B) 0.5~15 wt % of at least a basic compound; and (C) 0.1~10 wt % of a non-ionic surfactant having the structure

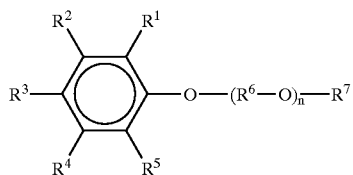

wherein:
R1, R2, R3, R4, R5, R6 and n are as defined above.

DETAILED DESCRIPTION OF THE PREFERRED EMBODIMENTS

Figure 1:
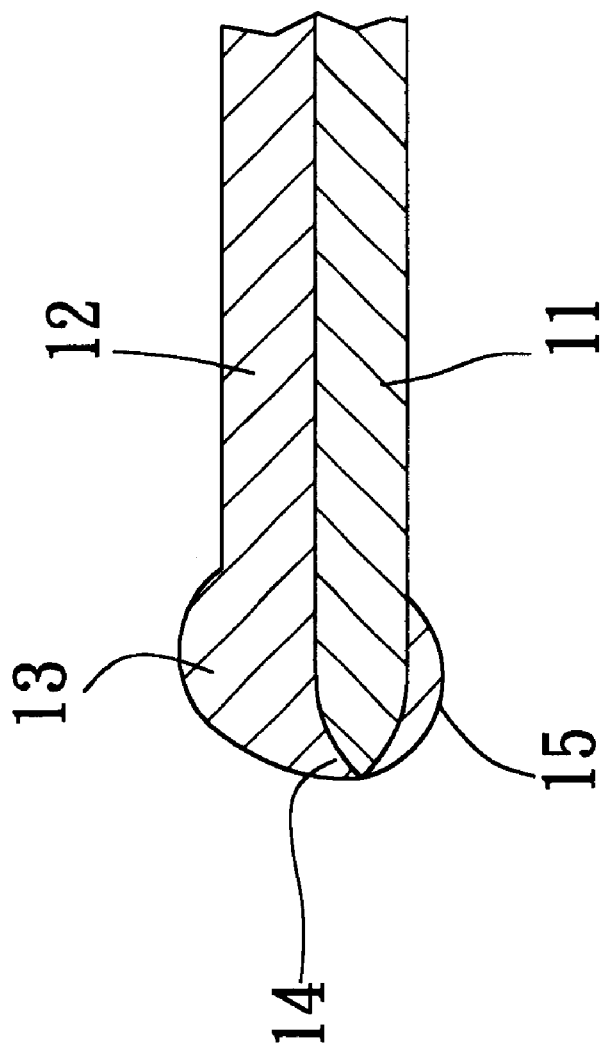
FIG. 1 is a fragmentary sectional view illustrating a substrate when coated with a photoresist layer in a conventional manner.

In the developer solution and edge bead remover composition of the present invention, water is used as a dispersion medium such that the composition has low toxicity and is not flammable to facilitate handling and disposal thereof, and such that the composition can be produced at a relatively low cost.

The basic compound (B) may be an organic basic compound or an inorganic basic compound. The organic basic compound is selected from the group consisting of ammonium hydroxides and organic amines. Examples of the ammonium hydroxides include tetramethyl ammonium hydroxide and 2-hydroxy trimethyl ammonium hydroxide. Examples of the organic amines include monomethylamine, dimethylamine, trimethylamine, diethylamine, triethylamine, monoiso-pyruamine, di-isopyruamine, ethanolamine, and mixtures thereof.

The inorganic basic compound may be an alkali metal compound or an alkaline earth metal compound, and is selected from the group consisting of lithium hydroxide, sodium hydroxide, potassium hydroxide, sodium hydrogen-phosphate, ammonium dihydrogen-phosphate, sodium dihydrogen-phosphate, potassium dihydrogen-phosphate, lithium phosphate, lithium silicate, potassium silicate, sodium silicate, lithium carbonate, potassium carbonate, sodium carbonate, lithium borate, sodium borate, and mixtures thereof.

When the developer solution composition of the present invention is used in developing treatment of an actinic ray-sensitive resist, the basic compound (B) is preferably an inorganic basic aqueous solution, such as alkali hydroxide, and is in an amount of 0.01~5 wt %, preferably 0.02~3.5 wt %, more preferably 0.03~1.5 wt %, based on 100 wt % of the liquid composition. When the amount of the basic compound (B) is below 0.01 wt %, the resulting developing effect is not good, and scum deposition is increased. When the amount of the basic compound (B) is more than 5 wt %, the developing effect is too strong, and the process cannot be well-controlled.

When the edge bead remover composition of the present invention is used for removing undesired photoresist stuck to the periphery of a substrate, the basic compound (B) is preferably an organic basic aqueous solution, such as tetramethyl ammonium hydroxide and 2-hydroxyl trimethyl ammonium hydroxide. The basic compound (B) is preferably in an amount of 0.5~15 wt %, preferably 0.75~15 wt %, more preferably 1.0~6 wt %, based on 100 wt % of the liquid composition. When the amount of the basic compound (B) is lower than 0.5 wt %, the resulting removing effect is poor, and scum deposition is increased. When the amount of the basic compound (B) is higher than 15 wt %, the removing process cannot be well-controlled, and the removing effect is not satisfactory.

The non-ionic surfactant (C) has the following structure (I):

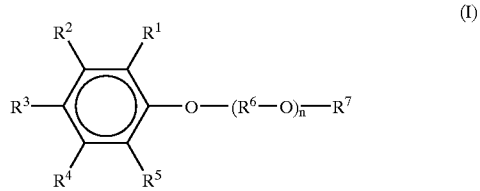

wherein:
R1, R2, R3, R4 and R5 are selected from the group consisting of hydrogen, alkyl, aryl, aralkyl and halogen.

At least two of R1, R2, R3, R4 and R5 are selected from the group consisting of aralkyl and aryl. That is, at least two of R1~R5 are both aralkyl or both aryl, or at least one of R1~R5 is aralkyl and another one of R1~R5 is aryl.

When the developer solution composition of the present invention is used in developing treatment of an actinic ray-sensitive resist, and when none or only one of R1~R5 of the non-ionic surfactant (C) contains an aryl (or aralkyl) group, the dispersion stability of the developer solution in the color photoresist is lowered, and the amount of scum deposition is increased. If the surfactant does not have the structure (I), the composition would have the above-described defects.

R6 is selected from the group consisting of ethylene, propylene, and butylene. R7 is selected from the group consisting of hydrogen, acetyl, alkyl, and aryl. n is an integer ranging from 6~23, preferably 6~18, more preferably 6~14. When n is lower than 6, the dispersion stability of the non-ionic surfactant (C) in water (A) is slightly reduced, the resulting developing effect is not good, and the amount of scum deposition is increased. When n is higher than 23, the dispersion stability is also reduced, the resulting developing effect is not good, and the range of operating temperature is narrowed.

When the edge bead remover composition of the present invention is used for removing undesired photoresist stuck to the periphery of the substrate, and when the surfactant does not have the structure (I), the dispersion stability of the composition in the photoresist is lowered, and the amount of scum deposition is increased.

R6 of the surfactant of the edge bead remover composition is selected from the group consisting of ethylene, propylene, and butylene. R7 is selected from, the group consisting of hydrogen, acetyl, alkyl, and aryl. n is an integer ranging from 6~23, preferably 6~18, more preferably 6~14. When n is lower than 6, the dispersion stability of the non-ionic surfactant (C) in water (A) is slightly reduced, the resulting removing effect is not good, and the amount of scum deposition is increased. When n is higher than 23, the dispersion stability is also reduced, the resulting removing effect is not good, and the range of operating temperature is narrowed.

With the use of the surfactant having the structure (I), the composition of the present invention is effective in removing the photoresist stuck to the periphery of an LCD substrate to result in reduced scum deposition, and has a good defoaming characteristic and a good dispersion stability.

Examples of the non-ionic surfactant (C) include, but are not limited to the following compounds:

(1) polyoxyethylene-3,5-bis(1-phenyl ethyl) phenyl ether, with the following structure, wherein n is 9,

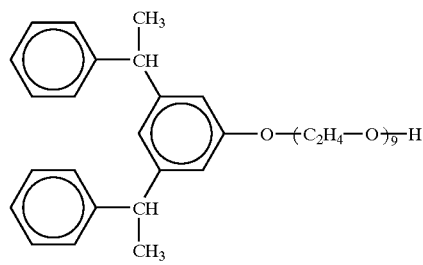

(2) polyoxyethylene-3,5-bis(1-phenyl ethyl) phenyl ether, with the following structure, wherein n is 12,

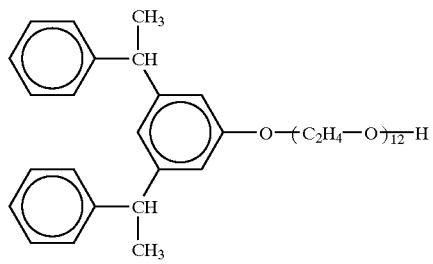

(3) polyoxyethylene-2,4,6-tris(1-phenyl ethyl)phenyl ether, with the following structure, wherein n is 9,

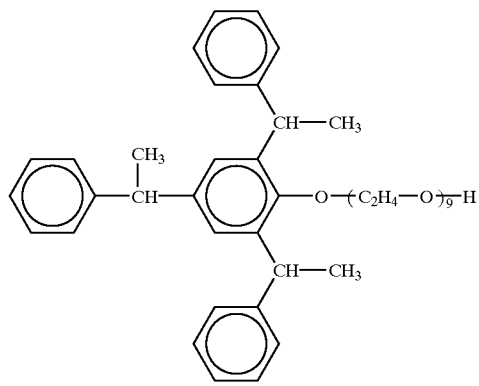

(4) polyoxyethylene-2,4,6-tris(1-phenyl ethyl)phenyl ether, with the following structure, wherein n is 12,

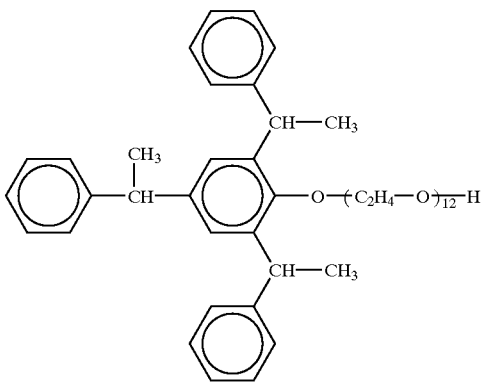

In addition to the non-ionic surfactant with the structure (I), the developer solution and edge bead remover composition of the present invention may include other surfactants, such as polyoxyethylene fatty acid ester, polyoxyethylene sorbitan fatty acid ether, polyoxyethylene alkyl ether, polyoxyethylene alkyl aryl ether, polyoxyethylene alkyl phenol ether, and combinations thereof.

Depending upon the use of the developer solution or edge bead remover composition of the present invention, the content of the non-ionic surfactant based on the total weight of the composition varies. When the composition is used in developing treatment of an actinic ray-sensitive resist, the content of the non-ionic surfactant is 0.01~3.5 wt %, preferably 0.03~2.5 wt %, more preferably 0.04~1.5 wt %, based on 100 wt % of the developer solution composition. When the content of the non-ionic surfactant (C) is lower than 0.01 wt %, the dispersion stability of the photoresist in the developer solution composition is reduced, and scum deposition is increased. When the content of the non-ionic surfactant (C) is higher than 3.5 wt %, the defoaming characteristic of the composition is not good to result in an adverse effect on smooth operation of the development process. When the composition of the present invention is used for removing undesired photoresist stuck to the periphery of a substrate, the content of the non-ionic surfactant is 0.1~10 wt %, preferably 0.2~6 wt %, more preferably 0.3~3 wt %. When the content of the non-ionic surfactant (C) is lower than 0.1 wt %, the dispersion stability of the edge bead remover composition is reduced, and the removing effect is not good. When the content of the non-ionic surfactant (C) is higher than 10 wt %, the defoaming characteristic of the composition is not good, and smooth operation of the removing process is adversely affected.

The composition of the present invention is suitable for use in removing color resist. The color resist may be a negative photoresist or a positive photoresist, and typically contains organic or inorganic dyes (colorants), polymer binder soluble in alkali solution, multi-functional monomer, photoinitiator and solvent. Examples of the polymer binder are thermoplastic novolac resin, acrylic resin, copolymer of maleic anhydride and/or half ester thereof, and polyhydroxy styrene. Acrylic resin is most suitable. The acrylic resin is a copolymer of (meth) acrylate and/or (meth) acrylic acid. Examples of the acrylic resin are as follows:

(1) Copolymer of methyl methacrylate/hydroxy styrene/styrene/methacrylic acid.

(2) Copolymer of benzyl methacrylate/methacrylic acid/styrene.

(3) Copolymer of methyl methacrylate/methacrylic acid/styrene.

(4) Copolymer of benzyl methacrylate/methacrylic acid/polystyrene macromonomer.

(5) Copolymer of methyl methacrylate/methacrylic acid/polystyrene macromonomer.

(6) Copolymer of methyl methacrylate/benzyl methacrylate/methacrylic acid.

(7) Copolymer of methylacrylic acid/benzyl methacrylate.

(8) Copolymer of methylacrylic acid/benzyl methacrylate/2-hydroxy ethyl methacrylate.

Evaluation of the composition (1) Effect

When the liquid composition of the present invention is used for removing undesired photoresist stuck to the periphery of an LCD substrate, the removing effect is evaluated by inspecting the peripheral appearance of the LCD substrate immersed in the edge bead remover solution and rinsed with a running stream of deionized water to see if the photoresist layer is straight. When the composition is used in developing treatment of an actinic ray-sensitive resist, the developing effect is evaluated by inspecting if the photoresist pattern is complete after developing using the liquid composition of the present invention.

○: Photoresist layer is straight or pattern is complete.

X: Photoresist layer is not straight or pattern is not complete.

(2) Scum Deposition

When the liquid composition of the present invention is used for removing. undesired photoresist at the periphery of the LCD substrate, the substrate, after being treated with the liquid composition of the present invention, is inspected using a 50 times microscope to see if scum deposition can be found on the substrate. When the liquid composition of the present invention is used in developing treatment of an actinic ray-sensitive resist for the manufacture of an LCD substrate, the LCD substrate, after being treated with the liquid composition of the present invention, is inspected using a 250 times microscope to see if scum deposition can be found on the non-patterned region of the substrate.

○: No scum deposition is found.

Δ: Small amount of scum deposition is found.

X: Large amount of scum deposition is found.

(3) Defoaming characteristic 20 cc sample of the liquid composition of the present invention is placed in a 100 ml messcylinder which is then shaken using a vertical shaker at a suitable frequency for 30 minutes. The messcylinder is then allowed to rest for one hour without shaking. The height of the foam formed in the cylinder is subsequently measured. The defoaming characteristic is evaluated based on the following:

○: lower than 1.5 cm

X : higher than 1.5 cm (4) Determination of the Range of Operating Temperature 20 cc sample of the liquid composition of the present invention is placed in a 100 ml messcylinder. Then, the messcylinder is placed in a glass beaker that contains water with a level higher than that of the liquid composition in the cylinder. The beaker is disposed on a hot plate and is heated until the liquid composition become turbid. The temperature is taken as the "turbid" temperature. The liquid composition is then cooled down to room temperature until it becomes clear. The temperature is taken as the "clear" temperature. The range of operating temperature is evaluated using an average of the "turbid" temperature and the "clear" temperature and based on the following:

○: above 45° C., indicating that the range of operating temperature is wide,

Δ: 38~45° C., indicating that the range of operating temperature is moderate, and X: below 38° C., indicating that the range of operating temperature is narrow.

(5) Dispersion Stability 250 g sample of the liquid composition of the present invention is added with 1 g of a color photoresist composition. The mixture is stirred and is then filtered through a 5 μm filter paper. The filter paper is then baked at 105° C. for one hour. The weight of the substance remaining on the filter paper is measured. The dispersion stability is evaluated based on the following:

○: net weight is lower than 0.04 g

X: net weight is greater than 0.04 g

Preparation Example Preparation of a Photoresist-coated Substrate

A 4-inch glass substrate was coated on a spinner with a photoresist composition, and was vacuum-dried at $10^{-2}$ torr for 10 seconds to form the photoresist layer. The photoresist composition has the following components:

| Component | | content |
|---|---|---|
| binder | Methacrylic acid/benzyl methacrylate copolymer | 8.4 g |
| Multi-functional monomer | Dipentaerythritol hexa acrylate | 0.24 g |
| Radiation initiator | 2-benzyl-2-N,N-dimeth ylamino-1-(4-morpholi no-phenyl)-1-butanone | 0.14 g |
| | 4,4'-bis(diethylamine) benzophenone | 0.04 g |
| Organic solvent | Propylene glycol methyl ether acetate | 9.54 g |
| Dye | PR177(Ciba Geigy, trade name: Red A2B) | 4.00 g |

The above components are mixed using a stirrer.

Examples 1~5 Using the liquid composition of the present invention in developing treatment of an actinic ray-sensitive resist.

The photoresist layer prepared in the Preparation Example is pre-baked at 110° C., and is then exposed pattern-wise to ultraviolet light on a minifying exposure machine through a test chart reticle. Thereafter, a development treatment is undertaken with the above-prepared developer solution at a temperature of 23° C. for 60 seconds by using a static-paddle development apparatus, followed by rinsing of the glass substrate for 30 seconds in a running stream of deionized water and drying. Contents of the developer solution composition are given in Table 1. After the development process, the substrate is post-baked at 235° C. for 40 minutes. The developer solution composition is evaluated by inspecting the appearance of the substrate using a microscope. The results are shown in Table 2.

Examples 6~8 Using the liquid composition of the present invention for removing undesired photoresist.

The periphery of the photoresist layer prepared in the Preparation Example is immersed in the edge bead remover composition of the present invention for about 10 seconds, and is then rinsed with water. Contents of the liquid composition are given in Table 3. The liquid composition is evaluated by inspecting the appearance of the substrate using a microscope. The results are shown in Table 4.

Comparative Examples 1~10

The procedures of Example 1 are repeated except for the contents of the liquid composition used. The contents of the liquid composition as used in the Comparative Examples are given in Table 1. The results are shown in Table 2.

Comparative Examples 11~21

The procedures of Example 6 are repeated except for the contents of the liquid composition used. The contents of the liquid composition as used in the Comparative Examples are given in Table 3. The results are shown in Table 4.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

TABLE 1

| | | | | | | | | | | | | | | | (all contents are based on weight percent) |
|---|---|---|---|---|---|---|---|---|---|---|---|---|---|---|---|
| | | | | | | Example No. | | | | | | | | | |
| | | Example | | | | | | | Comparative Example | | | | | | |
| Component | 1 | 2 | 3 | 4 | 5 | 1 | 2 | 3 | 4 | 5 | 6 | 7 | 8 | 9 | 10 |
| (A) water | 99.2 | 94.0 | 99.8 | 94.0 | 99.8 | 99.9 | 92.8 | 99.3 | 95.3 | 99.2 | 99.2 | 99.2 | 99.2 | 99.2 | 99.2 |
| (B) basic compound | | | | | | | | | | | | | | | |
| Potassium hydroxide | 0.7 | 3.0 | 0.1 | 3.0 | 0.1 | 0.005 | 7.0 | 0.7 | 0.7 | 0.7 | 0.7 | 0.7 | 0.7 | 0.7 | 0.7 |
| (C) surfactant | | | | | | | | | | | | | | | |
| Surfactant(1) | 0.1 | 3.0 | 0.1 | | | 0.1 | 0.2 | 0.4 | | | | | | | |
| Surfactant(2) | | | | 3.0 | 0.1 | | | | | | | | | | |
| Surfactant(3) | | | | | | | | | | 0.1 | | | | | |
| Surfactant(4) | | | | | | | | | | | 0.1 | | | | |
| Surfactant(5) | | | | | | | | | | | | 0.1 | | | |
| Surfactant(6) | | | | | | | | | | | | | 0.1 | | |
| Surfactant(7) | | | | | | | | | | | | | | 0.1 | |
| Surfactant(8) | | | | | | | | | | | | | | | 0.1 |

Note:
Surfactant(1): As shown in structure (I), wherein R1, R3 and R5 are hydrogen, R2, R4 are phenyl ethyl, R6 is ethylene, n = 9.
Surfactant(2): As shown in structure (I), wherein R2, R4 are hydrogen, R1, R3, and R5 are phenyl ethyl, R6 is ethylene, n = 9.
Surfactant(3): As shown in structure (I), wherein R1, R2, R4 and R5 are hydrogen, R3 is phenyl ethyl, R6 is ethylene, n = 9.
Surfactant(4): polyoxyethylene sorbitan fatty acid ether
Surfactant(5): octadecyl sodium benzene sulfonate
Surfactant(6): polyoxyethylene oleyl cetyl ether
Surfactant(7): As shown in structure (I), wherein R1, R3 and R5 are hydrogen, R2 and R4 are phenyl ethyl group, R6 is ethylene, n = 4.
Surfactant(8): As shown in structure (I), wherein R1, R3 and R5 are hydrogen, R2 and R4 are phenyl ethyl group, R6 is ethylene, n = 25.

TABLE 2

| Example No. | Effect | Residue | Defoaming Characteristic | Operating Temperature Range | Dispersion Stability |
|---|---|---|---|---|---|
| Example | | | | | |
| 1 | ○ | ○ | ○ | ○ | ○ |
| 2 | ○ | ○ | ○ | ○ | ○ |
| 3 | ○ | Δ | ○ | ○ | ○ |
| 4 | ○ | ○ | ○ | ○ | ○ |
| 5 | ○ | Δ | ○ | ○ | ○ |
| Comparative Example | | | | | |
| 1 | X | X | ○ | ○ | ○ |
| 2 | X | ○ | ○ | ○ | ○ |
| 3 | X | X | ○ | ○ | X |
| 4 | X | Δ | X | ○ | X |
| 5 | X | X | X | Δ | X |
| 6 | X | X | X | Δ | X |
| 7 | X | X | X | Δ | X |
| 8 | X | X | X | Δ | X |
| 9 | X | X | X | X | Δ |
| 10 | X | X | ○ | X | X |

TABLE 3

| | (all contents are based on weight percent) Example No. | | | | | | | | | | | | | |
|---|---|---|---|---|---|---|---|---|---|---|---|---|---|---|
| | Example | | | Comparative Example | | | | | | | | | | |
| Component | 6 | 7 | 8 | 11 | 12 | 13 | 14 | 15 | 16 | 17 | 18 | 19 | 20 | 21 |
| (A) water | 96 | 94 | 96 | 98.7 | 83 | 96.95 | 85 | 96 | 96 | 96 | 96 | 96 | | 89 |
| (B) basic compound | | | | | | | | | | | | | | |
| Tetramethyl ammonium hydroxide | 3 | 3 | 3 | 0.3 | 16 | 3 | 3 | 3 | 3 | 3 | 3 | 3 | | 3 |
| (C) surfactant | | | | | | | | | | | | | | |
| Surfactant(1) | 1 | 3 | | 1 | 1 | | | | | | | | | |
| Surfactant(2) | | | 1 | | | 0.05 | 12 | | | | | | | |
| Surfactant(4) | | | | | | | | 1 | | | | | | |
| Surfactant(5) | | | | | | | | | 1 | | | | | |
| Surfactant(6) | | | | | | | | | | 1 | | | | |
| Surfactant(7) | | | | | | | | | | | 1 | | | |
| Surfactant(8) | | | | | | | | | | | | 1 | | |
| (D) solvent DPM | | | | | | | | | | | | | 100 | 8 |

Note:
Surfactant(1): As shown in structure (I), wherein R1, R3 and R5 are hydrogen, R2, R4 are phenyl ethyl, R6 is ethylene, n = 9.
Surfactant(2): As shown in structure (I), wherein R2, R4 are hydrogen, R1, R3, and R5 are phenyl ethyl, R6 is ethylene, n = 9.
Surfactant(4): polyoxyethylene sorbitan fatty acid ether
Surfactant(5): octadecyl sodium benzene sulfonate
Surfactant(6): polyoxyethylene oleyl cetyl ether
Surfactant(7): As shown in structure (I), wherein R1, R3 and R5 are hydrogen, R2 and R4 are phenyl ethyl group, R6 is ethylene, n = 4.
Surfactant(8): As shown in structure (I), wherein R1, R3 and R5 are hydrogen, R2 and R4 are phenyl ethyl group, R6 is ethylene, n = 25.
DPM: dipropylene glycol monoethyl ether

TABLE 4

| Example No. | Effect | Residue | Defoaming Characteristic | Operating Temperature Range | Dispersion Stability |
|---|---|---|---|---|---|
| Example | | | | | |
| 6 | ○ | ○ | ○ | ○ | ○ |
| 7 | ○ | ○ | Δ | ○ | ○ |
| 8 | ○ | ○ | ○ | ○ | ○ |
| Comparative Example | | | | | |
| 11 | X | X | ○ | ○ | ○ |
| 12 | X | 0 | ○ | ○ | ○ |
| 13 | X | X | ○ | ○ | X |
| 14 | X | Δ | X | X | ○ |
| 15 | X | X | X | Δ | X |
| 16 | X | X | X | Δ | X |
| 17 | X | X | X | Δ | X |
| 18 | X | X | X | X | Δ |
| 19 | X | X | ○ | X | X |
| 20 | X | X | — | — | X |
| 21 | X | X | — | — | X |

We claim:

1. A developer solution composition which is provided for use in developing treatment of an actinic ray-sensitive resist, said developer solution composition comprising:

(A) water;

(B) 0.01~5 wt % of at least a basic compound; and (C) 0.01~3.5 wt % of a non-ionic surfactant having the structure (I):

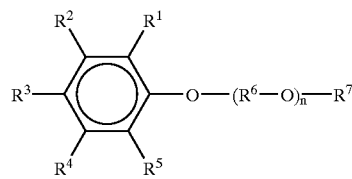

wherein:

$R^1$, $R^3$, and $R^5$ are selected from the group consisting of hydrogen, alkyl, aryl, aralkyl and halogen, and $R^2$ and $R^4$ are each phenyl ethyl, $R^6$ is selected from the group consisting of ethylene, propylene, and butylene, $R^7$ is selected from the group consisting of hydrogen, acetyl, alkyl, and aryl, and n is an integer ranging from 6 to 23.

2. A developer solution composition which is provided for use in developing treatment of an actinic ray-sensitive resist, said developer solution composition comprising:

(A) water;

(B) 0.01 ~5 wt % of at least a basic compound; and (C) 0.01~3.5 wt % of a non-ionic surfactant having the structure (I):

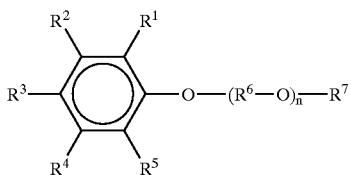

wherein:
$R^2$ and $R^4$ are selected from the group consisting of hydrogen, alkyl, aryl, aralkyl and halogen, and $R^1$, $R^3$ and $R^5$ are each phenyl ethyl,
$R^6$ is selected from the group consisting of ethylene, propylene, and butylene,
$R^7$ is selected from the group consisting of hydrogen, acetyl, alkyl, and aryl, and
n is an integer ranging from 6 to 23.

3. An edge bead remover composition for removing undesired photoresist residue stuck to the periphery of a liquid crystal display substrate, said edge bead remover composition comprising:
(A) water;
(B) 0.5~15 wt % of at least a basic compound; and
(C) 0.1~10 wt % of a non-ionic surfactant having the structure (I):

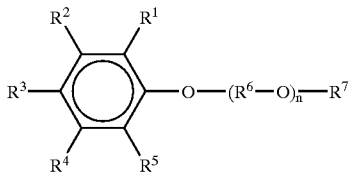

wherein:
$R^1$, $R^3$ and $R^5$ are selected from the group consisting of hydrogen, alkyl, aryl, aralkyl and halogen, and $R^2$ and $R^4$ are each phenyl ethyl,
$R^6$ is selected from the group consisting of ethylene, propylene, and butylene,
$R^7$ is selected from the group consisting of hydrogen, acetyl, alkyl, and aryl, and
n is an integer ranging from 6 to 23.

4. An edge bead remover composition for removing undesired photoresist residue stuck to the periphery of a liquid crystal display substrate, said edge bead remover composition comprising:
(A) water;
(B) 0.5~15 wt % of at least a basic compound; and
(C) 0.1~10 wt % of a non-ionic surfactant having the structure (I):

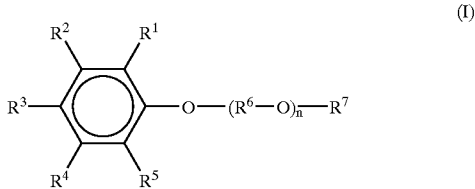

wherein:
$R^2$ and $R^4$ are selected from the group consisting of hydrogen, alkyl, aryl, aralkyl and halogen, and $R^1$, $R^3$ and $R^5$ are each phenyl ethyl,
$R^6$ is selected from the group consisting of ethylene, propylene, and butylene,
$R^7$ is selected from the group consisting of hydrogen, acetyl, alkyl, and aryl, and
n is an integer ranging from 6 to 23.

* * * * *